US007052731B2

(12) United States Patent
Koroyasu et al.

(10) Patent No.: US 7,052,731 B2
(45) Date of Patent: May 30, 2006

(54) PLASMA PROCESSING APPARATUS, PROTECTING LAYER THEREFOR AND INSTALLATION OF PROTECTING LAYER

(75) Inventors: Kunihiko Koroyasu, Kudamatsu (JP); Muneo Furuse, Kudamatsu (JP); Tomoyuki Tamura, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/963,575

(22) Filed: Oct. 14, 2004

(65) Prior Publication Data
US 2005/0045107 A1 Mar. 3, 2005

Related U.S. Application Data

(62) Division of application No. 10/083,546, filed on Feb. 27, 2002, now abandoned.

(51) Int. Cl.
*B05D 3/02* (2006.01)
(52) U.S. Cl. .............. 427/77; 427/336; 427/372.2; 427/384
(58) Field of Classification Search ........... 427/156, 427/336, 352, 302, 61, 77, 372.2, 445; 264/343; 156/83, 84, 85, 86
See application file for complete search history.

(56) References Cited

U.S. PATENT DOCUMENTS

| | | | |
|---|---|---|---|
| 4,397,724 A | | 8/1983 | Moran |
| 4,481,251 A | * | 11/1984 | Vratny ................. 428/312.6 |
| 5,098,498 A | * | 3/1992 | Hale et al. .............. 156/213 |
| 6,200,388 B1 | | 3/2001 | Jennings |
| 6,235,134 B1 | * | 5/2001 | Mueller ................... 156/83 |
| 6,263,829 B1 | * | 7/2001 | Schneider et al. ....... 118/723 I |
| 6,344,105 B1 | | 2/2002 | Daugherty et al. |
| 6,495,224 B1 | * | 12/2002 | Dutton ................. 428/34.9 |
| 6,620,736 B1 | | 9/2003 | Drewery |

FOREIGN PATENT DOCUMENTS

JP 4-62170 10/1992
JP 2001-57361 2/2001

* cited by examiner

*Primary Examiner*—Timothy Meeks
*Assistant Examiner*—Howard Abramowitz

(74) *Attorney, Agent, or Firm*—Antonelli, Terry, Stout and Kraus, LLP.

(57) ABSTRACT

The following plasma processing apparatus can suppress the production of contaminants from the plasma processing chamber of the apparatus and an article in the plasma processing chamber which are allowed to act as ground electrodes: a plasma processing apparatus in which a workpiece is processed by creating a plasma in the processing chamber, and one or more surfaces made of a grounded metal electric conductor which come into contact with the plasma in the plasma processing chamber are coated with a plasma-resistant polymeric material having a relationship between relative dielectric constant k∈ and thickness t (μm) of t/k∈<300, or a protecting layer formed of a plasma-resistant and water-absorbing resin material is adhered and fixed to the outer surface of an article in the processing chamber by its swelling and then shrinkage.

10 Claims, 5 Drawing Sheets

(a)

(b)

PLASMA PROCESSING APPARATUS, PROTECTING LAYER THEREFOR AND INSTALLATION OF PROTECTING LAYER

This application is a Divisional application of prior application Ser. No. 10/083,546, filed Feb. 27, 2002, now abandoned the contents of which are incorporated herein by reference in their entirety.

BACKGROUND OF THE INVENTION

This invention relates to a plasma processing apparatus for processing a workpiece by applying a high-frequency bias voltage to the workpiece by use of a plasma, a protecting layer for plasma processing apparatus provided in the processing chamber of the plasma processing apparatus, and a method for installing the protecting layer.

Apparatus such as that disclosed in JP-A-2001-57361 have been known as a plasma processing apparatus for processing a workpiece by applying a high-frequency bias voltage to the workpiece by use of a plasma. The apparatus disclosed in the above reference is as follows.

An antenna capable of emitting electromagnetic waves is provided in the upper part of a plasma processing chamber. A bottom electrode for setting a wafer thereon as a workpiece is provided in the lower part of the plasma processing chamber. A processing gas introduced into the plasma processing chamber is made into plasma by the interaction between electromagnetic waves emitted by the antenna and a magnetic field created by a magnetic-field-creating means. A wafer is subjected to etching treatment by controlling ions and radicals in the plasma by adjusting a bias electric power applied to the antenna and a bias electric power applied to the bottom electrode. For the etching treatment, a mixed gas containing a fluorocarbon type gas is used as the treating gas. Thus, a silicon dioxide film is etched.

A 2-mm thick sidewall sleeve composed of a resin layer of a polyether imide or the like is provided on the inner wall of the plasma processing chamber so as to be removable. Thus, contamination with a metal from a metal wall surface constituting the plasma treating chamber is prevented, and carbon-containing deposits are stably accumulated on the resin layer to suppress the production of contaminants.

As another prior art using a resin in order to prevent the contamination, that disclosed in the specification of U.S. Pat. No. 4,397,724 (JP-B-4-62170) can be exemplified. This reference discloses that a wafer is subjected to etching treatment after being mounted in a reactor at least some of the inner surfaces of which have been coated with a polyarylate polymer, and that a thickness of the coating of about one-sixteenth inch is advantageous.

BRIEF SUMMARY OF THE INVENTION

A first object of the present invention is to provide a plasma processing apparatus that permits easy replacement of a layer for protecting the outer surface of an article in the processing chamber of the apparatus.

A second object of the present invention is to provide a protecting layer for plasma processing apparatus that can easily be attached to the outer surface of an article in the processing chamber of a plasma processing apparatus.

A third object of the present invention is to provide a method for installing a protecting layer for plasma processing apparatus which permits easy attachment of the protecting layer to the outer surface of an article in the processing chamber of a plasma processing apparatus.

A fourth object of the present invention is to provide a plasma processing apparatus which permits protection of the outer surface of an article in the processing chamber of the apparatus without lessening the effect of the article in the processing chamber as an electrical ground for plasma.

A fifth object of the present invention is to provide a plasma processing apparatus which prevents contamination with a metal from a plasma processing chamber functioning as an electrical ground, and permits easy control of the temperatures of one or more surfaces exposed to a plasma in the processing chamber.

Other objects, features and advantages of the invention will become apparent from the following description of the embodiments of the invention taken in conjunction with the accompanying drawings.

DETAILED DESCRIPTION OF THE INVENTION

Figure 1:
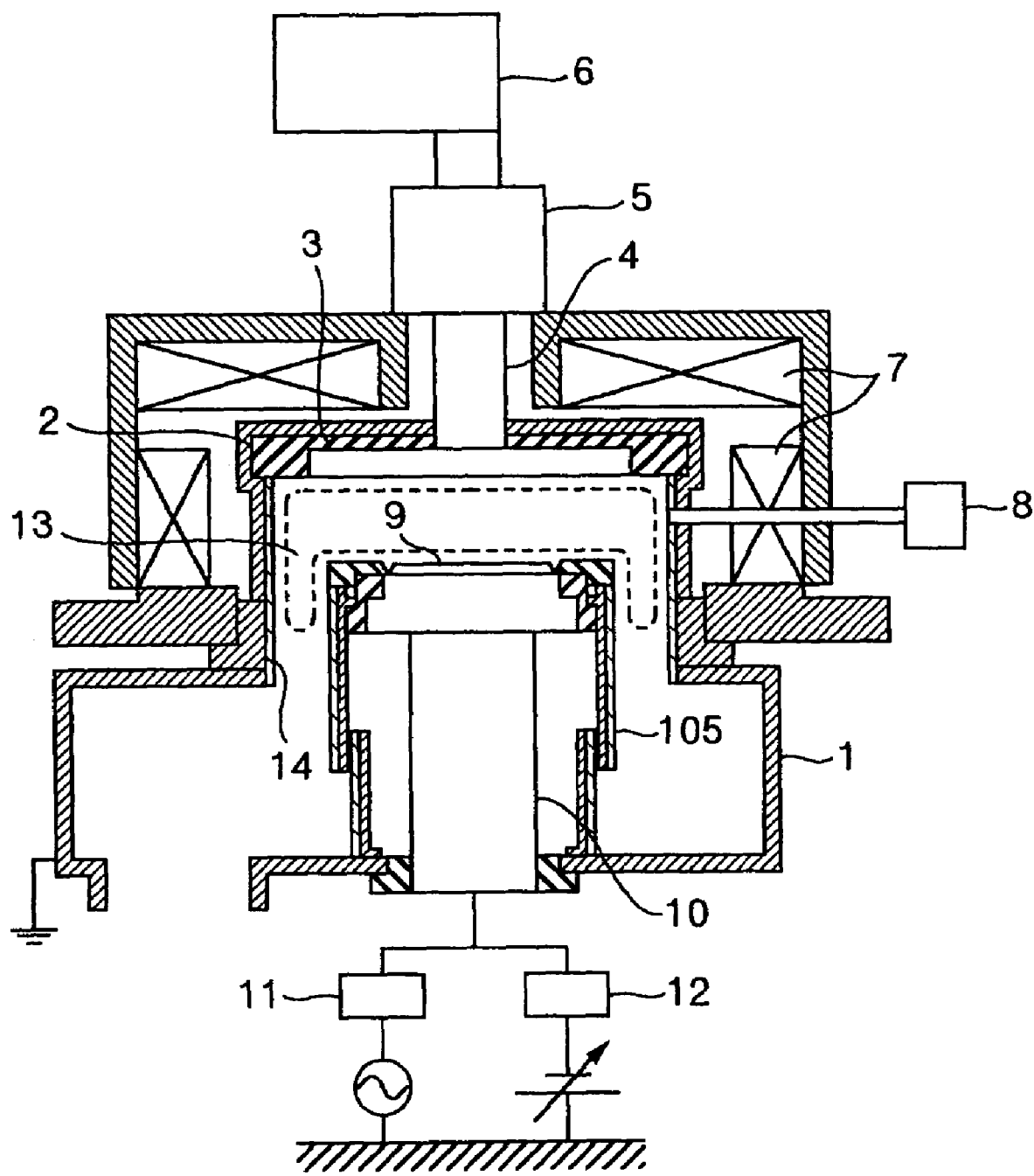
FIG. 1 is a vertical cross-sectional view showing a plasma etching apparatus as one example of the plasma processing apparatus of the present invention.

In a plasma etching apparatus, the production of contaminants in a processing chamber by plasma irradiation should be suppressed. In order to suppress the production of contaminants, a protecting layer is formed on each of the inner wall surface of the processing chamber and the surface of an article in the processing chamber. On the inner wall surface of the processing chamber, the production of contaminants can be suppressed by providing a sidewall sleeve (a cylindrical liner) made of a resin such as a polyether imide, on the inner wall surface as in the former prior art (JP-A-2001-57361) described above. On the surface of the article in the processing chamber, a plasma-resistant coating film is generally formed. The plasma-resistance coating film is formed by modification into a plasma-resistant material, such as anodized aluminum, or coating with a plasma-resistant polymeric material.

In the former prior art (JP-A-57361), the attachment of a resin layer (a protecting layer) to the inner wall surface of the processing chamber is taken into consideration, but grounding for plasma and the attachment of a resin layer to the surface of an article in the treating chamber are not sufficiently taken into consideration.

A high-frequency bias electric power should be applied to a bottom electrode in a process in which the introduction of high-energy ions is indispensable, such as etching of silicon dioxide film. On the other hand, in an apparatus in which the creation of a plasma and energy for the introduction of ions in the plasma into a wafer are independently controlled [e.g. an apparatus having in its plasma processing chamber an antenna capable of emitting electromagnetic waves of a high-frequency electric power, such as the antenna described above, and a bottom electrode which faces the antenna and to which a bias voltage is applied; or an apparatus having in its plasma processing chamber a top electrode to which a high-frequency electric power is supplied and a bottom electrode which faces the top electrode and to which a bias voltage is applied], the antenna or top electrode which faces the bottom electrode functions as a ground electrode with respect to a high-frequency electric power for bias applied to the bottom electrode. However, also in an apparatus having such a structure, the inner wall surface of the electrically grounded plasma processing chamber is etched by a plasma. This fact indicates that the antenna or top electrode which faces the bottom electrode does not function as a perfect electrical ground for high-frequency electric power. The fact also indicates that a sheath is formed between electrically grounded plasma processing chamber and the plasma, so that the plasma processing chamber also functions as an ground electrode for high-frequency electric power.

However, in the former prior art, the sidewall sleeve provided on the inner wall surface of the processing chamber is as thick as 2 mm. Therefore, the sidewall sleeve becomes a resistor between the processing chamber and a plasma to a high-frequency electric power, so that the processing chamber becomes ineffective as a ground electrode. As a result, the surface of the sidewall sleeve is covered with deposits composed of the components of a processing gas used in a plasma process, resulting in causing a problem of production of contaminants by the deposits.

In the former prior art, the outside diameter of the sidewall sleeve is made smaller than the inside diameter of inner wall of the processing chamber by about 0.1 mm to facilitate the installation of sidewall sleeve in the processing chamber. During plasma processing, the sidewall sleeve is swollen by heat introduced from a plasma, to adhere to the inner wall of the processing chamber. Thus, the conduction of heat between the sidewall sleeve and the inner wall of the processing chamber is improved. Such a sidewall sleeve, however, cannot be used on the outer surface of an article such as that in the processing chamber because it is thermally swollen during plasma processing.

On the other hand, in the method in which a plasma-resistant coating film is formed on the surface of an article in the processing chamber, the coating film is consumed by the sputtering action of ions from a plasma, so that the time of maintenance of the inhibitory effect on contaminants is determined by the thickness of the coating film. In addition, the thickness of the coating film is limited by a method for forming the coating film and hence cannot be increased without a limitation. If the coating film is consumed by repeated plasma processing operations, the coating film should be reformed. In such maintenance, the timing of reformation of the coating film and the cost of the reformation are important. Moreover, depending on the thickness of the coating film formed, the coating film becomes a resistor between a plasma and an article in the grounded processing chamber to lessen the effect of the article as an electrical ground.

Also in the latter prior art (the specification of U.S. Pat. No. 4,397,724 (JP-B-4-62170)) described above, an electrical ground for plasma is not sufficiently taken into consideration. When the inner wall of a plasma processing chamber is coated with a polyarylate polymer layer of about one-sixteenth inch in thickness as in the latter prior art, the inner wall does not function as an electrical ground for plasma. Therefore, a plasma diffuses in search of an electrical ground, so that it is used for etching as a low-density plasma. Moreover, since the ground potential is not determined, a plasma created in the plasma processing chamber diffuses, so that the plasma density on a wafer to be subjected to etching process is decreased. Accordingly, the etching rate of the wafer is decreased.

The present invention was made in order to solve the problems in the above prior arts.

The above first object of the present invention can be achieved as follow: in a plasma processing apparatus in which a workpiece is treated by creating a plasma in a processing chamber, a protecting layer formed of a plasma-resistant and water-absorbing resin material is adhered and fixed to the outer surface of an article in the processing chamber by its swelling and then shrinkage to prevent electrical insulation of the plasma and the article from each other.

The above second object can be achieved by forming a protecting layer on the outer surface of an article in the processing chamber of a plasma processing apparatus as follows: the protecting layer is formed of a plasma-resistant and water-absorbing resin material so as to have such a shape that the protecting layer becomes larger than the external shape of the article in the processing chamber when it absorbs water.

The above third object can be achieved as follows: in a method for installing a protecting layer to be provided on the outer surface of an article in the processing chamber of a plasma processing apparatus, the protecting layer is formed of a plasma-resistant and water-absorbing resin material and allowed to absorb water to be swollen, and the article in the processing chamber is inserted into the protecting layer, after which water is evaporated from the protecting layer by heating to shrink the protecting layer, whereby the protecting layer is fixed to the article in the processing chamber.

In addition, the above third object can be achieved as follows: in a method for installing a protecting layer to be provided on the outer surface of an article in the processing chamber of a plasma processing apparatus, said protecting layer is formed of a plasma-resistant and water-absorbing resin material and allowed to absorb water to be swollen, and the article in the processing chamber is inserted into the protecting layer, after which water contained in said protecting layer is evaporated while keeping said protecting layer at a pressure lower than atmospheric pressure, to shrink the protecting layer, whereby the protecting layer is fixed to said article.

The above fourth object can be achieved as follows: in a plasma processing apparatus in which a workpiece is processed by creating a plasma in a processing chamber, a protecting layer formed of a plasma-resistant and water-absorbing resin material comprising a polymeric material having a relationship between relative dielectric constant $k\in$ and thickness t (µm) of $t/k\in<300$ is adhered and fixed to the outer surface of an article in the processing chamber by its swelling and then shrinkage to prevent electrical insulation of the plasma and the article from each other.

The above fifth object can be achieved as follows: in a plasma processing apparatus in which the creation of a plasma and the control of energy for the introduction of ions into a workpiece are independently carried out, one or more surfaces made of a grounded metal electric conductor which come into contact with the plasma in a plasma processing chamber are coated with a plasma-resistant polymeric material having a relationship between relative dielectric constant $k\epsilon$ and thickness t (µm) of $t/k\in<300$.

The plasma-resistant polymeric material is formed into a cylindrical liner whose outside diameter is larger than the inside diameter of the plasma processing chamber.

Silicone resin is located on the periphery surface of the cylindrical liner, and the cylindrical liner is closely attached to the inner surface of the plasma processing chamber through the silicone resin.

Alternatively, the plasma-resistant polymeric material is formed on the inner surface of the plasma processing chamber by spraying or coating.

Another embodiment is as follows: in a plasma processing apparatus for oxide film in which the creation of a plasma and the control of energy for the introduction of ions into a workpiece are independently carried out, the inner wall surface of a plasma processing chamber which is made of a grounded metal electric conductor and in which the plasma is created is coated with a plasma-resistant polymeric material having a relationship between relative dielectric constant $k\in$ and thickness t (µm) of $t/k\in <300$.

Further another embodiment is as follows: in a plasma processing apparatus equipped with a plasma processing chamber in which at least one surface to be exposed to plasma is made of a grounded metal; a plasma-creating means for creating a plasma with a plasma density of $1 \times 10^3/cm^3$ (charged particles/$cm^3$) or more in the plasma processing chamber; a workpiece holder provided in the plasma treating chamber in order to set a workpiece thereon; and a high-frequency bias power source connected to the workpiece holder and capable of giving an energy sufficient to introduce ions in the plasma into the workpiece, the RF output of said high-frequency bias power source being 1 KW or more, the inner wall surface of metal portion of the plasma processing chamber is coated with a plasma-resistant polymeric material having a grounding function with respect to the RF output.

Still another embodiment is as follows: in a plasma processing apparatus in which the creation of a plasma and the control of energy for the introduction of ions into a workpiece are independently carried out, one or more surfaces made of a grounded metal electric conductor which come into contact with the plasma in a plasma processing chamber are coated with a plasma-resistant polymeric material containing one or more electroconductive materials.

The protecting layer formed on the inner wall of a plasma processing chamber should have the following properties: it does not cause contamination of a wafer owing to plasma processing such as etching or does not scatter contaminants or the like on a wafer, and the processing chamber functions as a ground electrode for giving a reference potential to a plasma. Therefore, as a material for the protecting layer, there is used a material which does not become a cause of the contamination or a source of contaminants, for example, a member made of a plasma-resistant polymeric material composed of elements which constitute a gas used in an etching process and a material to be etched. In addition, a material and a structure which have a low electrical resistance value are used so that the plasma processing chamber may act as an electrical ground.

As a method for locating a plasma-resistant polymeric material on the inner wall surface of a plasma processing chamber, there are a method of forming the plasma-resistant polymeric material into a cylindrical liner having an outside diameter larger than the inside diameter of the plasma processing chamber, and adhering and fixing the cylindrical liner to the inner wall surface of the plasma processing chamber by utilizing the tension of the material itself, and a method of providing the material on the inner wall surface by spraying or applying the material on the inner wall surface. In both methods, a metal constituting the plasma processing chamber, i.e., a vacuum chamber is not directly exposed to a plasma, so that the metal or the like is not scattered from the wall. Thus, floating contaminants are not deposited on the surface of a wafer for a semiconductor device and hence does not cause an undesirable wiring failure. Furthermore, since the plasma-resistant polymeric material is provided on the inner wall surface of the plasma processing chamber so as to adhere thereto closely, the conduction of heat from the inner wall of the plasma treating chamber is improved by temperature controlling of the plasma processing chamber and the surface which comes into contact with a plasma can be thermostated with good controllability even in a narrow temperature range (temperature region), so that it becomes possible to prevent the adhesion of deposits easily.

As to a protecting layer formed on the surface of an article to be exposed to a plasma in the plasma processing chamber, the timing of reformation of the protecting layer and the cost of the reformation are important. Moreover, depending on the thickness of the protecting layer formed, the protecting layer becomes a resistor between a plasma and the protected article to lessen the effect of the article as an electrically grounded ground electrode. Therefore, it is effective to attach a polymeric material as plasma-resistant protecting member to the article in the processing chamber in the form of a liner whose thickness can be freely set. The liner should be closely adhered to the periphery surface of the article so as not to get out of position, in order to protect the article against the plasma while allowing the article in the processing chamber to function as a ground electrode (i.e. as an electrical ground), by utilizing the liner made of the plasma-resistant polymeric material. A method for attaching the liner is as follows. For example, when the periphery surface of a cylindrical article such as a bottom-electrode cover is protected, a cylindrical liner having an inside diameter a little smaller than the outside diameter of the article is formed of a water-absorbing plasma-resistant material such as a polyimide at first. Then, the liner is allowed to absorb water and the article is inserted into the liner swollen by the water absorption. The integrated body of the cylindrical article and the liner is heated or placed in a vacuum atmosphere, to evaporate the water contained in the liner and shrink the liner. Thus, the plasma-resistant liner can be strongly fixed even to the article in the processing chamber, such as the cylindrical article.

When a polymeric material (relative dielectric constant $k\in$ about 2.1 to about 4.2) such as a polyamide-imide, polyether ether ketone, polyimide, polyether imide, polytetrafluoroethylene, polybenzoimidazole or the like is used as a material for the plasma contact surface in the plasma processing chamber, metals such as iron, chromium and nickel and metal compounds such as aluminum fluoride are not released from the plasma contact surface.

Furthermore, a grounding function can be imparted to the plasma processing chamber by setting the thickness of the plasma-resistant polymeric material attached to each of the inner wall surface of the plasma processing chamber and the periphery surface of an article in the processing chamber to a thickness smaller than a predetermined thickness. In prior art, a plasma cover is located on the inner wall of a plasma processing chamber and the thickness of the cover is specified, but physical property values of a material for the cover are not taken into consideration. Whether the inner wall of the plasma processing chamber serves as an electrical ground for a plasma or not is determined by the thickness and relative dielectric constant of the material, and it was found that the value of the relationship between relative dielectric constant k∈ and thickness t (μm) (t/k∈) is important. It was also found that the specification of values of the above relative dielectric constant k∈ and thickness t (μm) is important particularly in the case of a polymeric material because the relative dielectric constant changes depending on starting materials to be mixed, the sequence state and temperature.

It is also possible to allow a plasma-resistant material to function as an electrical ground for plasma, by incorporating one or more electroconductive materials such as silicon, carbon, etc. into the plasma-resistant material. In this case, a protecting layer for the wall contains the electroconductive material(s) and acts as an electrical ground, so that a plasma does not diffuse widely in the plasma processing chamber. Since the silicon and/or carbon incorporated into the plasma-resistant material is the same as in the case of an element and a resist material, a wafer is not contaminated therewith.

Moreover, since a plasma-resistant material composed of the above-exemplified polymeric material is composed mainly of elements such as carbon, oxygen and hydrogen which are the same as the components of a resist, it has no undesirable influence on the processing of a wafer.

Thus, the amount of contaminants on a wafer to be subjected to plasma processing and the degree of contamination of the wafer can be reduced, so that the fraction defective of the wafers subjected to plasma processing can be reduced. Therefore, the productivity of the plasma processing apparatus itself can be improved by locating the plasma-resistant material according to the present invention on the plasma contact surface in the plasma processing chamber of the apparatus.

Examples of the present invention are explained below with reference to FIGS. 1 to 5.

FIG. 1 shows a plasma etching apparatus to which the present invention has been applied. In detail, FIG. 1 shows an ECR type plasma etching apparatus in which an antenna emits electromagnetic waves and a plasma is created by the interaction between the electromagnetic waves and a magnetic field. The temperature of the inner wall surface of a plasma processing chamber, i.e., an etching chamber 1 in this case can be adjusted in a temperature range of 20 to 100° C. by a thermostating means not shown. An antenna 3 is located in the upper part of the etching chamber 1 in this case through a dielectric 2. A high-frequency power source 6 capable of generating UHF electromagnetic waves in this case is connected to the antenna 3 through a coaxial line 4 and a matching box 5. The dielectric 2 provided between the etching chamber 1 and the antenna 3 can transmit electromagnetic waves. A magnetic-field coil 7 for forming a magnetic field in the etching chamber 1 is provided around the periphery of the etching chamber 1. A bottom electrode 10 as a workpiece holder for setting a wafer 9 thereon as a workpiece is provided under the antenna 3 in the etching chamber 1. To the bottom electrode 10 are connected a high-frequency bias power source 11 for giving energy for introduction into the wafer 9 to ions in a plasma and a DC power source 12 for adsorbing the wafer 9 electrostatically on the bottom electrode 10. Numeral 8 denotes a gas feeder for feeding a processing gas into the etching chamber 1.

The etching chamber 1 is made of a metal and is grounded. The inner wall surface of the etching chamber 1 is coated with a resin layer 14 composed of a plasma-resistant polymeric material. In this case, the resin layer 14 is a 630-μm thick cylindrical liner made of a polytetrafluoroethylene. The outside diameter of the resin layer 14 is made larger than the inside diameter of the etching chamber 1 by about 0.2 to about 0.3 mm so that the resin layer 14 may be closely adhered to the inner wall of the etching chamber 1 when set in the etching chamber 1. In this case, the adhesion is further improved when the resin layer 14 is set in the etching chamber 1 after locating flexible silicone resin with a high thermal conductivity on the outer surface of the resin layer 14 or thinly coating a silicone resin on outer surface of the resin layer 14. Thus, the difference between the temperatures of the resin layer 14 and the inner wall of the etching chamber 1 is narrowed down. The frequency of reformation of the resin layer 14 is preferably reduced by increasing the thickness of the resin layer 14. Therefore, a plasma-resistant polymeric material having as high a relative dielectric constant k∈ as possible is preferably used.

When the resin layer 14 is too thin to be formed into a cylindrical liner, the resin layer 14 can be formed in the etching chamber 1 by dissolving the resin in a solvent, spraying the resulting solution, and controlling the thickness of the resin layer 14 by adjusting, for example, the number of spraying operations. In this case, the thermal conductivity is further improved because the resin layer is completely adhered to the inner wall surface of the etching chamber 1.

When the resin layer 14 have a thickness of more than about 500 μm, it can be formed into a cylindrical liner. When the resin layer 14 is formed by the spraying method, it can be formed in a thickness of upto about 500 μm. In addition, when the spraying method is adopted, the resin layer 14 can be formed in a thickness of about 800 μm or more by incorporating one or more electroconductive materials such as a silicon, carbon, etc. into the resin layer 14.

Figure 2:
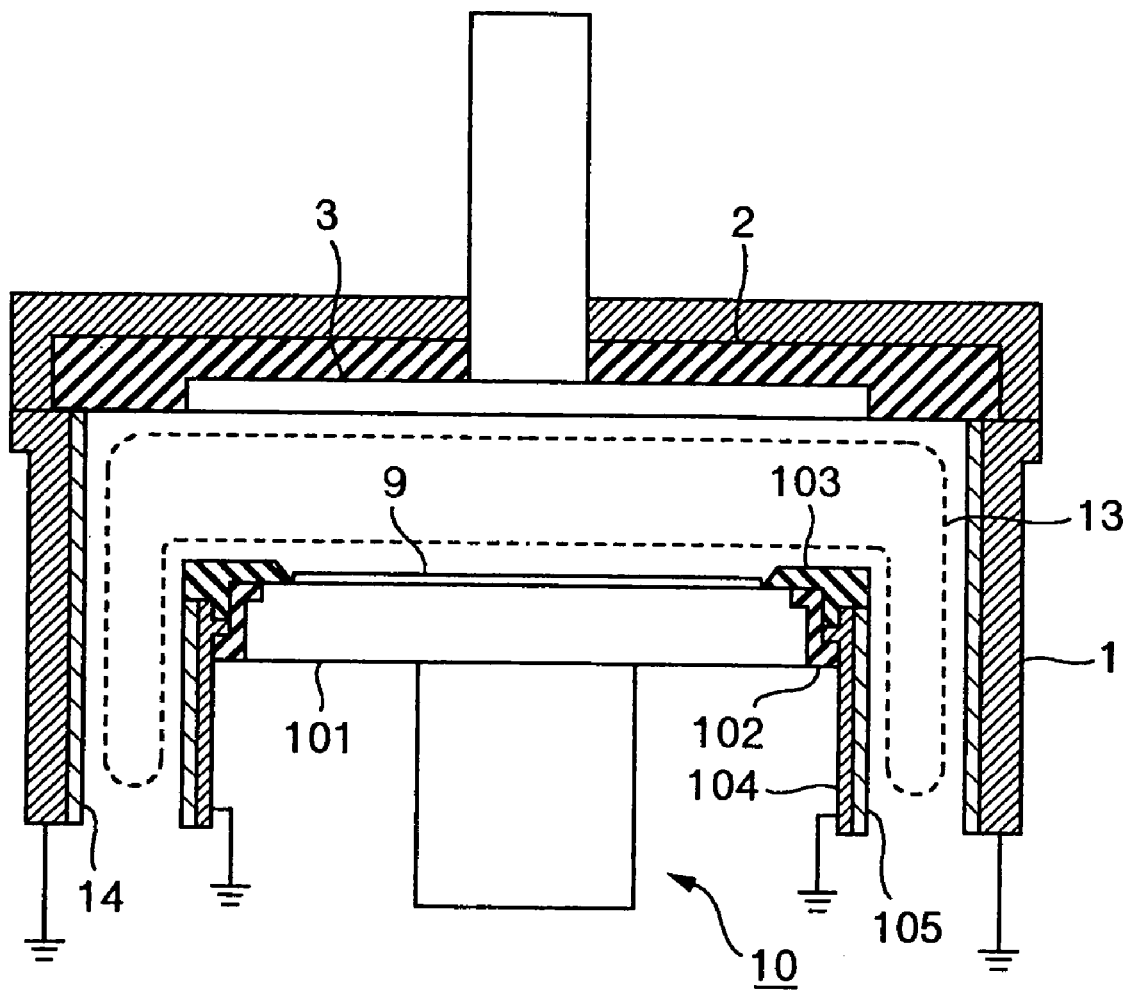
FIG. 2 is a vertical cross-sectional view showing the details of the bottom electrode portion of the apparatus shown in FIG. 1 and portions around the bottom electrode.
Figure 3:
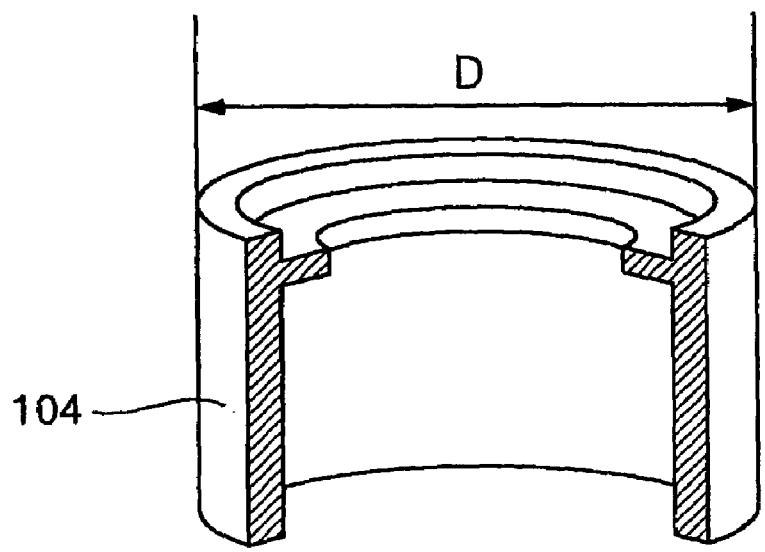
FIG. 3A and FIG. 3B are perspective cross-sectional views of a bottom-electrode cover and a cylindrical liner, respectively.
Figure 3:
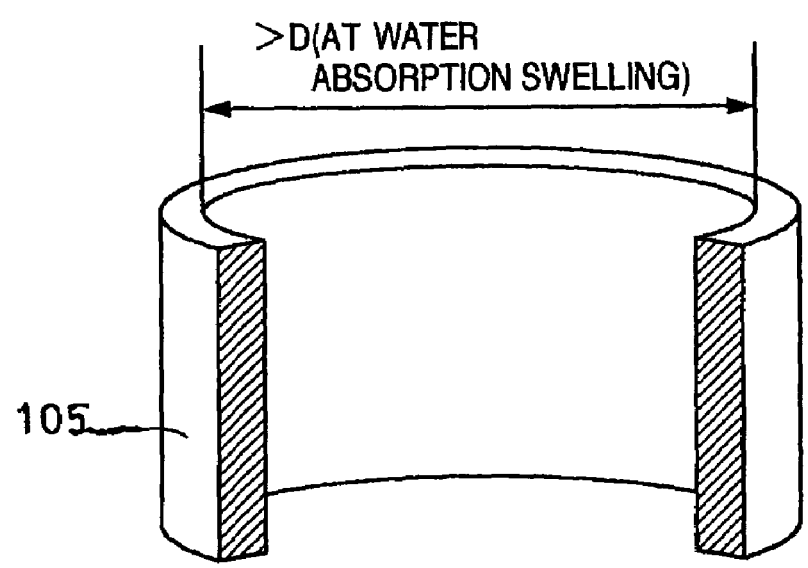

FIG. 2 is a detail view of the bottom electrode 10. A grounded electrode cover 104 is provided at the periphery of an electrode 101 through an insulating material 102. A cylindrical liner 105, i.e., a cylindrical protective member molded from a polyimide in this case is adhered and fixed to the periphery surface of the electrode cover 104. The purpose of grounding the electrode cover 104 is to prevent the diffusion of a plasma 13 caused when the plasma 13 misses the ground potential. Numeral 103 denotes an insulating cover covering the periphery of the wafer 9 on the electrode 101.

In the apparatus constructed in the manner described above, UHF electromagnetic waves outputted from the high-frequency power source 6 are supplied to the etching chamber 1 from the antenna 3 through the matching box 5, the coaxial line 4 and the dielectric 2. On the other hand, a magnetic field is formed in the etching chamber 1 by the solenoid coil 7 around the etching chamber 1. An etching gas introduced into the etching chamber 1 is efficiently made into plasma by the interaction of the electric field due to electromagnetic waves and the magnetic field due to the solenoid coil. Using this plasma 13, the wafer 9 on the bottom electrode 10 is subjected to a predetermined etching process. As the plasma used for such a process, a plasma having a density of about $1 \times 10^{10}/cm^3$ or more is used. In the etching process, energy for the introduction of ions in the plasma into the wafer 9 is set so as to give a desirable etched shape, by controlling the energy by use of the high-frequency bias power source 11. In a process requiring a high bias voltage, such as the etching process of an insulating film typified by a silicon dioxide film, the RF output from the high-frequency bias power source 11 should be 1 kW or more.

On the other hand, electric circuits are formed among an electrical ground, the high-frequency bias power source 11, the bottom electrode 10, the plasma 13 and the antenna 3 and between the etching chamber 1 and an electrical ground, respectively. In this case, an ion sheath is formed also between the etching chamber 1 and the plasma 13, so that ions in the plasma 13 are introduced into the inner wall of the etching chamber 1. In the vicinity of the bottom electrode 10, an ion sheath is formed also between the grounded electrode cover 104 and the plasma 13, so that ions in the plasma 13 are introduced also into the outer wall of the electrode cover 104.

In this case, a grounding function can be imparted to the plasma-resistant protecting layer (the cylindrical liner 105) attached to the surface of the electrode cover 104, in the plasma processing chamber (the etching chamber 1) by setting the thickness of the protecting layer at a thickness not larger than a predetermined thickness.

A sheath of plasma is present in the vicinity of the inner wall surface of the plasma processing chamber in which a plasma has been created and in the vicinity of the outer surface (the outer wall surface) of an article in the processing chamber. When the plasma is used for etching, the thickness of the sheath is determined by the plasma density. The plasma density is determined by the composition of a gas used and an RF output employed. For example, when the density of the plasma created is about $1 \times 10^{10}/cm^3$, the thickness of the sheath is about 600 μm. The relative dielectric constant $k\in$ in the sheath is about 1.0, and the sheath resistance between the plasma and the wall can be considered to be 600/1.0=600. When a resistor made of a resin or Alumilite is inserted between the sheath and the wall, it was experimentally found that the wall can be regarded as an electrical ground for the plasma even if such a resistor having a resistance about one-half (about 300) as high as the sheath resistance is inserted.

Therefore, under conditions which satisfy the condition $t/k\in<300$ wherein $k\in$ is the relative dielectric constant of the resistor inserted between the sheath and the wall and t (mm) is the thickness of the resistor, the wall covered with the resistor acts as an electrical ground for the plasma. According to this fact, the thickness of the resistor can be about 1065 μm or less when a polyimide resin (relative dielectric constant: 3.55) is used as the resistor. The thickness of the resistor can be about 630 μm or less when a polytetrafluoroethylene (relative dielectric constant: 2.1) is used as the resistor.

For example, when a silicon dioxide film is etched with a CF type gas ($C_4F_8$, $C_5F_8$ or the like), CxFy ions are produced in the plasma 13 and are drawn toward the etching chamber 1. In this case, the CxFy ions are introduced into the resin layer 14 because the resin layer 14 is provided on the inner wall surface of the etching chamber 1. Since the resin layer 14 of a polymeric material is composed of a CHF type compound and hence has the same components as the ion components in the plasma, reaction products produced by the reaction of ions in the plasma with the resin layer 14 and the components of the resin layer 14 subjected to sputtering by the ions are also CF type compounds. Therefore, their undesirable influences on the etching process can be prevented. Thus, the resin layer 14 according to the present example is effective in a process in which a CF type gas is used as a processing gas.

When the relative dielectric constant $k\in$ of the resin layer 14 is taken as 2.1, the thickness of the resin layer 14 having a relationship of $t/k\in<300$ is 630 μm. When the material according to the present example, i.e., a cylindrical liner of polytetrafluoroethylene is used, the etching chamber 1 can be allowed to act as an electrical ground. Therefore, the potential of the plasma 13 can be stabilized, so that a desirable etching process can be carried out by applying a necessary bias voltage to the wafer 9 by use of the high-frequency bias power source 11.

In a process in which the application of a high bias voltage to the wafer 9 is unnecessary in etching process of a silicon dioxide film or the like, the sheath voltage between the etching chamber 1 and the plasma 13 is low, so that the thickness of the resin layer 14 should be reduced.

Figure 4:
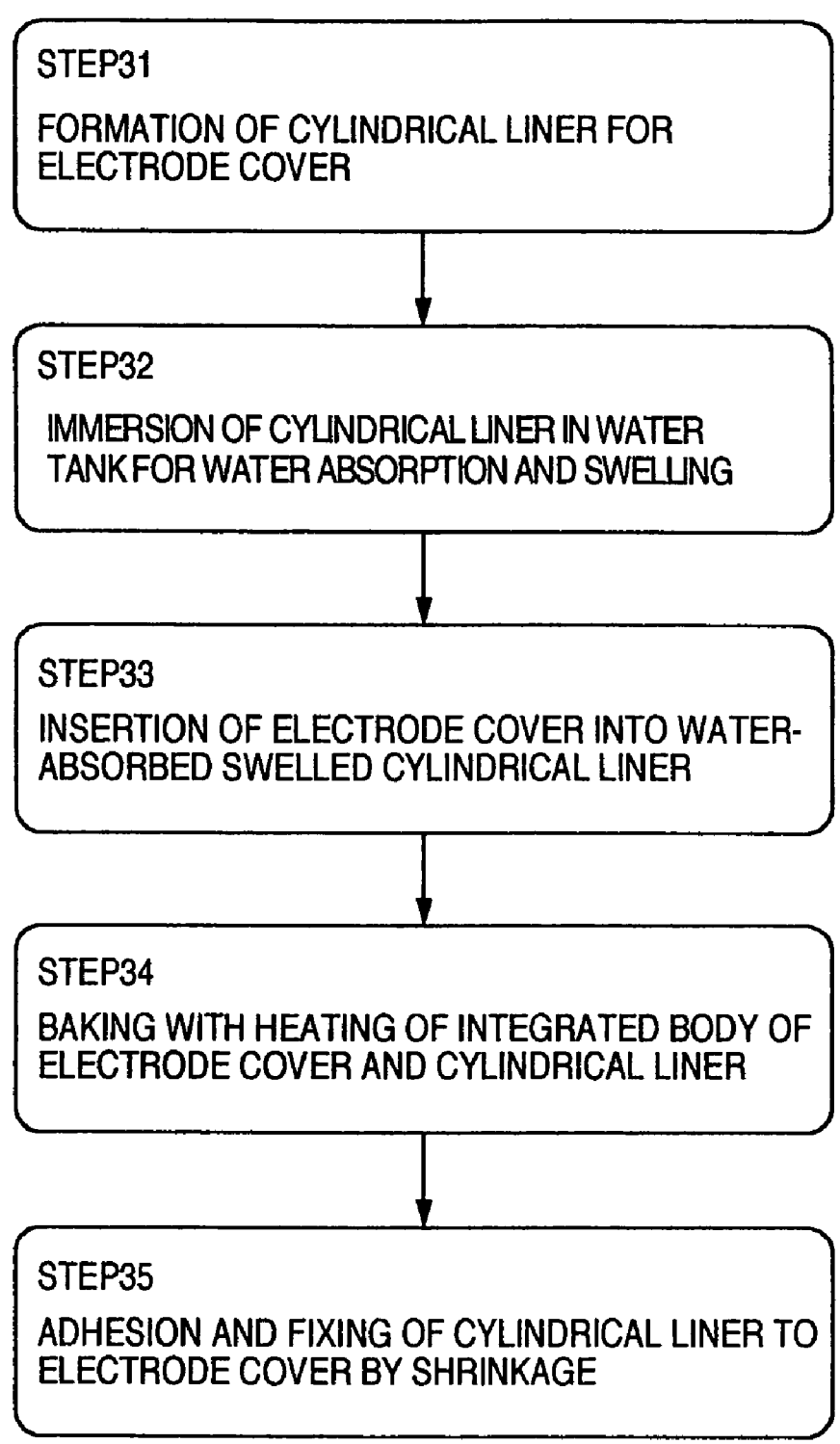
FIG. 4 is a flow chart showing a method for attaching the cylindrical liner to the bottom-electrode cover of the apparatus shown in FIG. 2.

FIG. 3A shows a schematic perspective section of the electrode cover 104. FIG. 3B shows a schematic perspective section of the cylindrical liner 105 made of a polyimide which is a protecting layer. FIG. 4 shows a flow chart in the case of attaching the cylindrical liner 105 to the electrode cover 104.

At first, the cylindrical liner 105 as a polyimide protective member for the electrode cover 104 is formed so that its inside diameter may become larger than the outside diameter of the electrode cover 104 when the cylindrical liner 105 absorbs water to swell. That is, the inside diameter of the cylindrical liner 105 is set at a size a little smaller than the outside diameter of the electrode cover 104 in view of the expansion coefficient of the cylindrical liner 105 at the time of water absorption (shown in step 31 in FIG. 4). Although the thickness of the cylindrical liner 105 can be freely set, it should be set according to the output of high-frequency electric power so that the cylindrical liner 105 may become an electrical ground for a high-frequency voltage applied to the bottom electrode 10.

Figure 5:
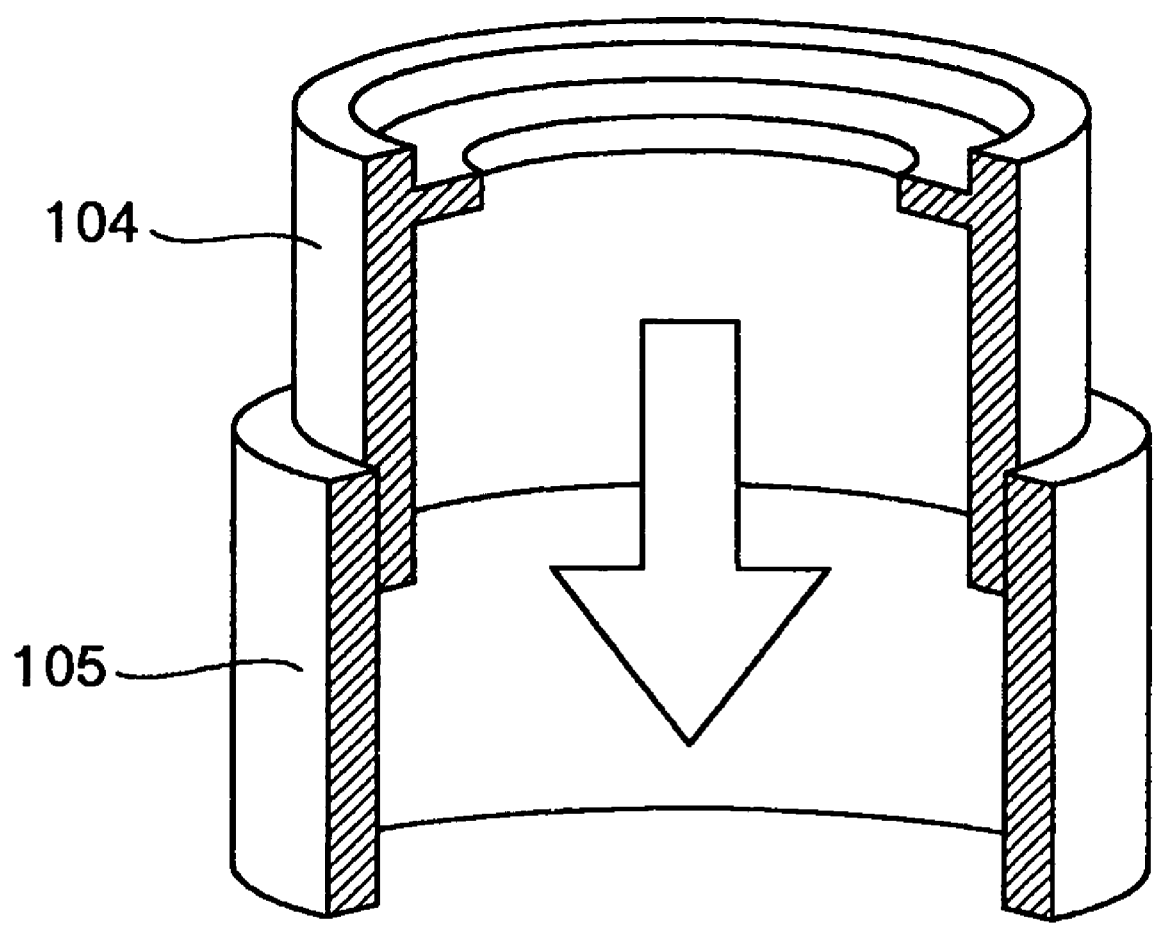
FIG. 5 is a perspective cross-sectional view showing a combination of the bottom-electrode cover and cylindrical liner of the apparatus shown in FIG. 2.

Then, the cylindrical liner 105 formed in the manner described above is allowed to absorb water by its immersion in a vessel containing pure water at ordinary temperature, to be swollen (shown in step 32 in FIG. 4). In this case, the inside diameter of the cylindrical liner 105 becomes a little larger than the outside diameter of the electrode cover 104. Although pure water at ordinary temperature is absorbed above, employment of warm water is also effective. Or, in place of immersing in the pure water tank, the pure water can be sprayed for water absorption, or there may be used in place of the pure water an alcohol or the like, which the liner absorbs to swell. Thereafter, as shown in FIG. 5, the electrode cover 104 is inserted into the water-absorbed swelled cylindrical liner 105 (shown in step 33 in FIG. 4). Next, the cylindrical liner 105 having the electrode cover 104 inserted thereinto is heated in a baking furnace to evaporate water and shrink the liner (shown in step 34 in FIG. 4). In this case, the heating temperature is set at a temperature that deteriorates neither the electrode cover 104 nor the cylindrical liner 105. Owing to the shrinkage, the cylindrical liner 105 as a protective member is adhered and fixed to the electrode cover 104 (shown in step 35 in FIG. 4). As a method for evaporating water, there may be adopted a method of maintaining the cylindrical liner 105 having the electrode cover 104 inserted thereinto, at a pressure lower than atmospheric pressure, or a combination of this method and heating may be employed.

As described above, according to the present example, the protecting layer as a plasma-resistant protective member is adhered and fixed to each of the inner wall surface of the plasma processing chamber and an article in the plasma processing chamber, whereby contamination with metals from the inner wall surface and the article surface can be prevented. Moreover, by optimizing a material for covering the inner wall surface and the article surface and the thickness of the layer, a grounding function can be imparted to these surfaces.

In addition, in the present example, the plasma creation and the control of energy for the introduction of ions into the wafer are independently carried out, so that a plasma having a necessary density can be stably created without any influence of the control of energy for the introduction of ions. In such an etching processing apparatus, the etching chamber can be regarded as an electrical ground by coating the grounded inner wall surface of the etching chamber with a plasma-resistant polymeric material having a relationship between relative dielectric constant k∈ and thickness t (μm) of t/k∈<300, so that a stable plasma potential can be given.

Although a polyimide is used as a material for the protective member of plasma-resistant polymeric material in the example, there may be used other plasma-resistant and water-absorbing polymeric materials such as polyamide-imides, polyether ether ketones, polyether imides, polytetrafluoro-ethylenes, polybenzoimidazoles, etc.

According to the present example, in the case of etching a wafer into a desirable shape by applying a bias voltage obtained at a high-frequency output of 1 kW or more to the bottom electrode which etching requires a high energy for the introduction of ions in a plasma into the wafer, the following advantages can be obtained. Even if the inner wall surface of the etching chamber and an article in this processing chamber are etched by their reaction and sputtering, contamination with metals from the etching chamber and the article in this processing chamber can be prevented because the inner wall surface of the etching chamber and the surface of the article in this processing chamber are protected with the plasma-resistant polymeric material containing the same components as those of a processing gas system. Moreover, the reaction products and sputtered layer produced by the inner wall surface have no undesirable influence on the process because they have the same components as those of the processing gas system. Thus, the fraction defective of wafers subjected to the etching process can be reduced, so that the productivity of the etching apparatus can be improved. Furthermore, since the inner wall surface of the etching chamber 8 is coated with the plasma-resistant polymeric material, the heat of the thermostated etching chamber is efficiently transmitted to the plasma-resistant polymeric material, so that the temperatures of one or more surfaces to be exposed to the plasma can easily be controlled.

According to the present example, a resin layer can be provided on the inner wall surface of the etching chamber so as to be closely adhered to the inner wall surface. Therefore, the temperature of the inner surface of the resin layer can be equalized with the temperature of the thermostated etching chamber, and reaction products produced during the etching process of a silicon dioxide film can be prevented from depositing on the inner wall surface of the etching chamber, by adjusting the wall surface temperature of the etching chamber to about 80° C. or higher.

According to the present example, the resin layer can be provided on the inner wall surface of the etching chamber so as to be closely adhered to the inner wall surface. Therefore, the temperature of the inner surface of the resin layer can be equalized with the temperature of the thermostated etching chamber, and reaction products produced during the etching process of a silicon dioxide film can be deposited on the inner wall surface of the etching chamber so as to be strongly adhered to the inner wall surface, by adjusting the wall surface temperature of the etching chamber to about 40° C. or lower. Accordingly, peeling of the adhered deposits can be prevented, so that the adhesion of contaminants derived from the reaction products to the wafer by their scattering can be prevented.

According to the present example, the plasma-resistant polymer protecting layer can easily be attached also to the outer surface of an article as in the case of the surface of an article in the etching chamber by forming the protecting layer into a cylindrical liner and swelling the liner by water absorption. The liner can easily be closely adhered to the article by evaporating (removing) water from the liner attached to the article.

Although a method for attaching the cylindrical liner to the cylindrical article is described in the present example, the present invention can be conducted in the same manner as above not only in the case of a cylindrical article but also in the case of an article having, for example, a polygonal shape or the like.

In addition, although the plasma etching apparatus is described in the present example, an article in a processing chamber can be protected by the same means as above also in other plasma processing apparatus.

When one or more electroconductive materials are incorporated into the plasma-resistant polymeric material, the resin layer itself tends to be thinned by a plasma. However, since the resin layer has electroconductivity, a grounding function can be imparted to the resin layer even when the thickness of the resin layer is increased. Moreover, the thickness of the resin layer can easily be increased. Therefore, such a resin layer is effectively used in an apparatus in which a process using a low bias voltage is employed.

The present example have the following other characteristics.

(1) A plasma processing apparatus for oxide film in which the creation of a plasma and the control of energy for the introduction of ions into a workpiece are independently carried out, said apparatus being characterized in that the inner wall surface of a plasma processing chamber which is made of a grounded metal electric conductor and in which the plasma is created is coated with a plasma-resistant polymeric material having a relationship between relative dielectric constant k∈ and thickness t (μm) of t/k∈<300.

(2) A plasma processing apparatus equipped with a plasma processing chamber in which at least one surface to be exposed to plasma is made of a grounded metal; a plasma-creating means for creating a plasma with a plasma density of $1 \times 10^{10}/cm^3$ or more in said plasma processing chamber; a workpiece holder provided in said plasma processing chamber in order to set a workpiece thereon; and a high-frequency bias power source connected to said workpiece holder and capable of giving an energy sufficient to introduce ions in said plasma into said workpiece, the RF output of said high-frequency bias power source being 1 KW or more, which apparatus is characterized in that the inner wall surface of metal portion of said plasma processing chamber is coated with a plasma-resistant polymeric material having grounding function with respect to said RF output.

(3) A plasma processing apparatus in which the creation of a plasma and the control of energy for the introduction of ions into a workpiece are independently carried out, said apparatus being characterized in that one or more surfaces made of a grounded metal electric conductor which come into contact with said plasma in a plasma processing chamber are coated with a plasma-resistant polymeric material containing one or more electroconductive materials.

According to the present invention described above, the following effect can be obtained: a protecting layer member can easily be attached to the outer surface of an article in the processing chamber of a plasma processing apparatus, so that the protecting layer can easily be replaced.

According to the present invention, the following effect can also be obtained: there can be provided a method for attaching a protecting layer for plasma processing apparatus which permits easy attachment of the protecting layer to the outer surface of an article in the processing chamber of a plasma processing apparatus.

In addition, according to the present invention, the following effect can also be obtained: there can be provided a plasma processing apparatus which permits protection of the outer surface of an article in the processing chamber of the apparatus without lessening the effect of the article in the processing chamber as an electrical ground for plasma.

Furthermore, according to the present invention, the inner surface of a plasma processing chamber can be made into an electrical ground for plasma by setting the thickness of a material covering the inner wall surface of the plasma processing chamber and an article in the processing chamber at such a thickness that the relationship between the relative dielectric constant $k\in$ and thickness $t$ ($\mu$m) of the material is $t/k\in<300$. It is also possible to prevent contamination with metals from the plasma processing chamber and an article in the processing chamber which are allowed to act as ground electrodes. The present invention has such an effect that a protecting layer can be installed so as to be closely adhered and that the temperatures of one or more surfaces exposed to a plasma can easily be controlled.

It should be further understood by those skilled in the art that the foregoing description has been made on embodiments of the invention and that various changes and modifications may be made in the invention without departing from the spirit of the invention and scope of the appended claims.

What is claimed is:

1. In a method for installing a protecting layer for a plasma processing apparatus to be provided on the outer surface of an article in the processing chamber of a plasma processing apparatus, the improvement wherein said protecting layer is formed of a plasma-resistant and water-absorbing resin material and allowed to absorb water to be swollen, and the article in the processing chamber is inserted into the protecting layer, after which water is evaporated from said protecting layer by heating to shrink said protecting layer, whereby the protecting layer is fixed to said article, said article being an electrode cover, and said protecting layer being in a form of a cylindrical liner.

2. The method according to claim 1, wherein said protecting layer has a relative dielectric constant in the range of about 2.1 to about 4.2.

3. The method according to claim 1, wherein said resin material is selected from the group consisting of polyimide, polyamide-imide, polyether ether ketone, polyether imide, polytetrafluoroethylene and polybenzoimidazole.

4. The method according to claim 1, wherein, prior to being swollen, the protecting layer has an inside diameter smaller than the outside diameter of the electrode cover, and wherein after being swollen the inside diameter of the protecting layer is larger than the outside diameter of the electrode cover.

5. The method according to claim 1, wherein said protecting layer has a relative dielectric constant and a thickness in $\mu$m such that a ratio of thickness to relative dielectric constant is less than 300.

6. In a method for installing a protecting layer for a plasma processing apparatus to be provided on the outer surface of an article in the processing chamber of a plasma processing apparatus, the improvement wherein said protecting layer is formed of a plasma-resistant and water-absorbing resin material and allowed to absorb water to be swollen, and the article in the processing chamber is inserted into the protecting layer, after which water contained in said protecting layer is evaporated while keeping said protecting layer at a pressure lower than atmospheric pressure, to shrink the protecting layer, whereby the protecting layer is fixed to said article, said article being an electrode cover, and said protecting layer being in a form of a cylindrical liner.

7. The method according to claim 2, wherein said protecting layer has a relative dielectric constant in the range of about 2.1 to about 4.2.

8. The method according to claim 6, wherein said resin material is selected from the group consisting of polyimide, polyamide-imide, polyether ether ketone, polyether imide, polytetrafluoroethylene and polybenzoimidazole.

9. The method according to claim 6, wherein, prior to being swollen, the protecting layer has an inside diameter smaller than the outside diameter of the electrode cover, and wherein after being swollen the inside diameter of the protecting layer is larger than the outside diameter of the electrode cover.

10. The method according to claim 6, wherein said protecting layer has a relative dielectric constant and a thickness in $\mu$m such that a ratio of thickness to relative dielectric constant is less than 300.

* * * * *